(12) United States Patent
Shah et al.

(10) Patent No.: US 10,495,294 B2
(45) Date of Patent: Dec. 3, 2019

(54) THERMAL MANAGEMENT FOR LIGHT-EMITTING DIODES

(71) Applicant: Intel Corporation, Santa Clara, CA (US)

(72) Inventors: Ketan R. Shah, Olympia, WA (US); Sean M. Halton, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/601,207

(22) Filed: May 22, 2017

(65) Prior Publication Data

US 2017/0321873 A1    Nov. 9, 2017

Related U.S. Application Data

(63) Continuation of application No. 13/977,400, filed as application No. PCT/US2011/066581 on Dec. 21, 2011, now Pat. No. 9,657,931.

(51) Int. Cl.
| | |
|---|---|
| *F21V 29/00* | (2015.01) |
| *F21V 29/506* | (2015.01) |
| *F21V 29/85* | (2015.01) |
| *F21V 29/74* | (2015.01) |
| *H01L 33/64* | (2010.01) |
| *F21V 3/02* | (2006.01) |
| *F21V 29/71* | (2015.01) |

(Continued)

(52) U.S. Cl.
CPC ............ *F21V 29/506* (2015.01); *F21K 9/232* (2016.08); *F21V 3/02* (2013.01); *F21V 29/71* (2015.01); *F21V 29/74* (2015.01); *F21V 29/745* (2015.01); *F21V 29/77* (2015.01); *F21V 29/78* (2015.01); *F21V 29/85* (2015.01); *H01L 24/00* (2013.01); *H01L 33/642* (2013.01); *F21V 3/061* (2018.02); *F21V 3/062* (2018.02); *F21V 29/70* (2015.01); *F21V 29/773* (2015.01); *F21V 29/83* (2015.01); *F21V 29/87* (2015.01); *F21V 29/89* (2015.01); *F21Y 2101/00* (2013.01); *F21Y 2115/10* (2016.08); *H01L 2924/00* (2013.01); *H01L 2924/0002* (2013.01)

(58) Field of Classification Search
CPC ........ F21V 29/506; F21V 29/71; F21V 29/74; F21V 29/745; F21V 29/77; F21V 29/78; F21V 29/85; F21V 3/02; F21V 29/70; F21V 29/773; F21V 29/83; F21V 29/87; F21V 29/98; F21V 3/061; F21V 3/062; F21V 3/0418; F21K 9/232; H01L 33/642; F21Y 2115/10
USPC .... 315/185 R, 150–152, 291, 307, 308, 312; 362/249.02, 294, 298–301, 373, 800
See application file for complete search history.

(56) References Cited

U.S. PATENT DOCUMENTS

| | | | |
|---|---|---|---|
| 8,414,160 B2 * | 4/2013 | Sun | F21K 9/90 313/46 |
| 8,523,395 B2 * | 9/2013 | Igaki | F21K 9/90 362/256 |

(Continued)

*Primary Examiner* — Jimmy T Vu

(57) ABSTRACT

Embodiments of the invention provide lighting systems that employ light-emitting diode (LED) chips as active lighting elements. Heat management components for the LED chips employed in the lighting sources are provided. In embodiments of the invention, LED chips are cooled by one or more heatspreaders and heat sinks attached to a substrate that houses the LED chip and/or the topside of the LED chip.

10 Claims, 13 Drawing Sheets

(51) Int. Cl.
*F21V 29/77* (2015.01)
*F21V 29/78* (2015.01)
*F21K 9/232* (2016.01)
*H01L 23/00* (2006.01)
F21V 3/06 (2018.01)
F21V 29/83 (2015.01)
F21V 29/87 (2015.01)
F21V 29/89 (2015.01)
F21Y 101/00 (2016.01)
F21Y 115/10 (2016.01)
F21V 29/70 (2015.01)

(56) References Cited

U.S. PATENT DOCUMENTS

2007/0279862 A1* 12/2007 Li .................... F21V 29/004
  361/692
2011/0163683 A1 7/2011 Steele et al.
2011/0298352 A1* 12/2011 Velu .................... F21V 29/74
  313/46

* cited by examiner

THERMAL MANAGEMENT FOR LIGHT-EMITTING DIODES

CROSS-REFERENCE TO RELATED APPLICATIONS

This application is a continuation of, claims the benefit of and priority to previously filed U.S. patent application Ser. No. 13/977,400 filed Jun. 28, 2013, now U.S. Pat. No. 9,657,931, entitled "THERMAL MANAGEMENT FOR LIGHT-EMITTING DIODES", which is a U.S. national stage entry of PCT/US2011/066581; both of the above are incorporated herein by reference in their entirety.

FIELD OF THE INVENTION

Embodiments of the invention relate generally to light-emitting diodes, thermal management for light-emitting diodes, and heat sinks and heat spreaders.

BACKGROUND INFORMATION

Light sources that use light-emitting diodes (LEDs) for light production consume less power than incandescent and halogen lights. Unlike fluorescent lights, LEDs contain no mercury. LEDs are typically built on a semiconductor chip. In operation, however, LED chips see temperature increases that can limit the usability and lifetime of the LED chip. Temperature increases can also cause color shifts in the emitted LED light. Even a small shift in light color can cause color mis-matches between otherwise identical LEDs that are visible to the human eye. Unlike incandescent lights, LED-based lights do not give off excess heat as light and natural convection cooling is minimal. The heat production associated with LEDs during operation presents challenges for lighting sources that seek to employ LED chips. Challenges include, producing light bulbs that employ LED chips that are reliable, efficient, and cost-effective at higher wattages, and providing heat management solutions for LED light bulbs that are used in confined spaces.

DETAILED DESCRIPTION OF THE INVENTION

Embodiments of the invention provide lighting systems that employ light-emitting diode (LED) chips as active lighting elements. Additionally, heat management components for the LED chips employed in the lighting systems are provided. The lighting systems can be, for example, in the form of traditional light bulbs, recessed lighting fixtures, strip lighting fixtures, back lighting units, or other enclosed/encased LED lighting configurations. In embodiments of the invention, LED chips are cooled by one or more of heatspreaders and/or heat sinks attached to a substrate for the LED chip and the topside of the LED chip itself.

Figure 1A:
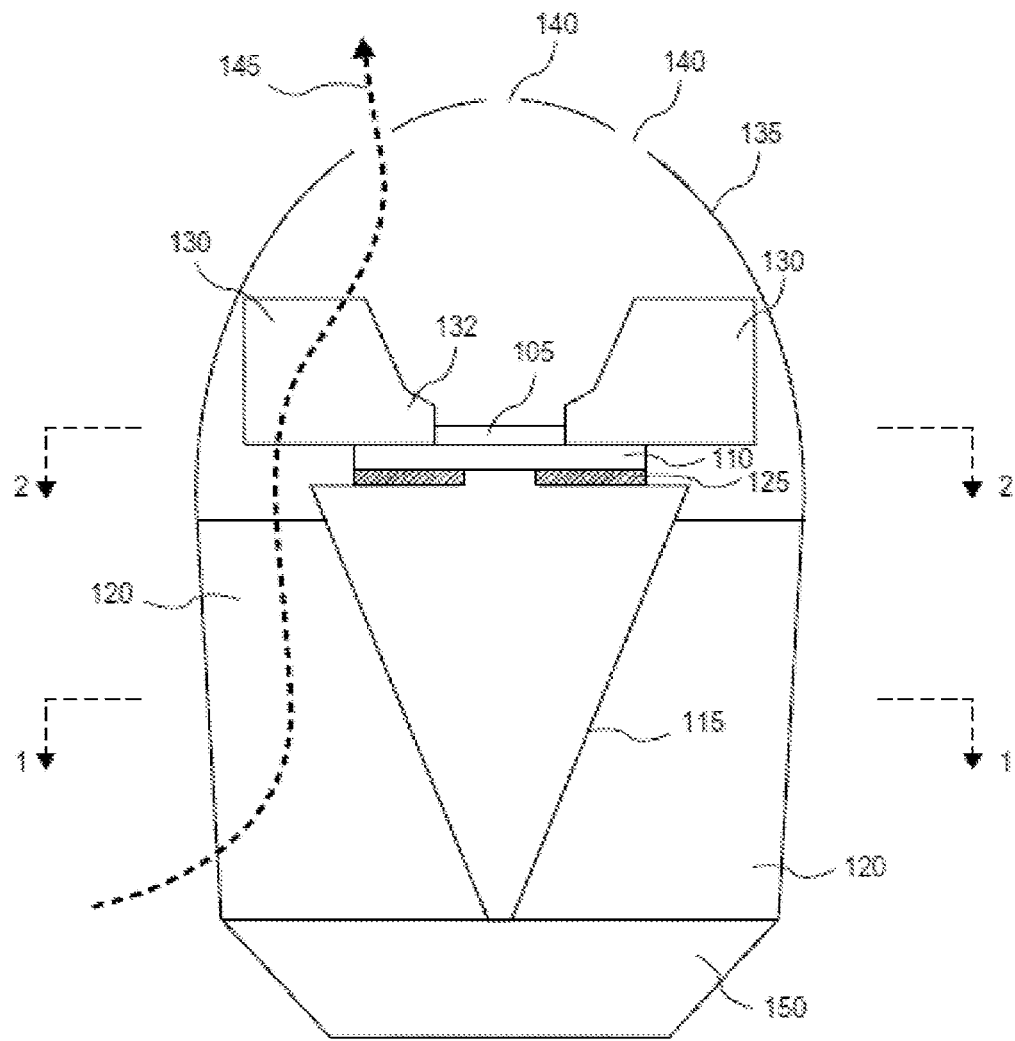
FIGS. 1A-D are schematic diagrams illustrating cross-sectional views of lighting systems employing LED chips as light producing elements.
Figure 1B:
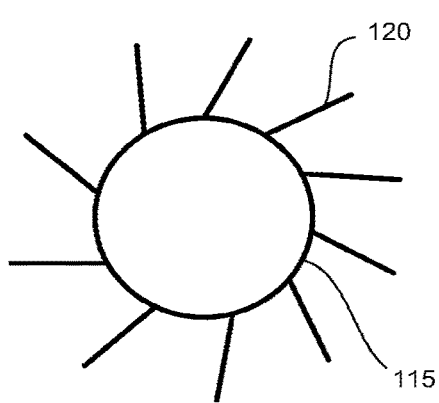
Figure 1C:
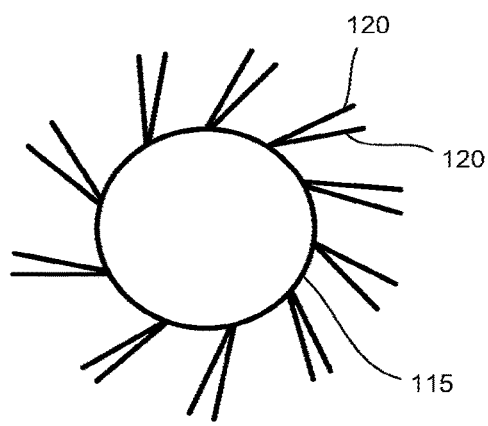

FIGS. 1A-B illustrate lighting structures in which LED chips are employed as light-producing elements. In FIG. 1A, a LED chip 105 is mounted on a substrate 110. In embodiments of the invention, the substrate 110 provides electrical interconnections between the LED chip 105 and additional electronic components (not shown) and a power source (not shown). Substrate 110 is a circuit board or other type of substrate, such as, for example, a board or a metal backed board. Additional electronics can include LED driver and dimmer control circuits and can be housed on an IC chip mounted on a substrate or circuit board located for example, inside conical heat spreader 115. Optionally, the IC chip comprising additional electronics can be mounted on substrate 110. Alternately, some or all of these additional electronics can be housed on the LED chip 105 itself. Optionally, more than one LED chip 105 is mounted on substrate 110. Conical heat spreader 115 comprises radial fins 120. Conical heat spreader 115 and radial fins 120 can be separate joined pieces. FIGS. 1B and C illustrate alternate cross-sectional views of a cut along the line 1-1 of FIG. 1A. Different geometries and patterns for radial fins are possible. Additionally, although ten radial fins 120 are illustrated in FIG. 1B, and twenty radial fins are illustrated in FIG. 1C, other numbers of radial fins 120 are also possible, including larger and smaller numbers of fins. FIG. 1C shows a plurality of double radial fins 120. Other numbers of associated radial fins 120 are also possible such as triple or quadruple radial fins. Plural radial fins, such as double, triple, and quadruple radial fins are fins that originate from the same location on the conical heat spreader. Radial fins 120 can have sizes, shapes, geometries, relative angles, and/or orientations that are different from the embodiments depicted in FIGS. 1A-D. Conical heat spreader 115 is thermally coupled to substrate 110 through optional thermal interface material 125. Conical heat spreader 115 and fins 120 are comprised of a heat conductive material, such as, for example, a metal, such as for example, copper and/or aluminum, or a thermally conductive plastic, although other materials are also possible. Thermal interface material 125 is comprised of, for example, indium, a phase change material, a ceramic-polymer composite, a metal-polymer composite, or a graphite-polymer composite, where a polymer can be a grease, a gel, an elastomer, or a thermosetting plastic. In alternate embodiments, conical heat spreader 115 is thermally coupled to substrate 110 though physical contact or through a grease, a gel, an elastomer, a thermosetting plastic, or other material.

Figure 1D:
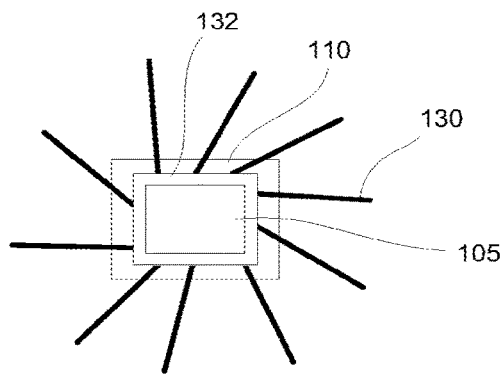

A second thermal management component shown in FIGS. 1A and D, includes surface fins 130 and heat transfer collar 132, which are thermally associated with substrate 110 and LED chip 105. The surface fins 130 can be thermally associated with substrate 110 and LED chip 105 through, for example, a thermal interface material (not shown) or other material located between them, through physical contact, or a combination thereof. A view of a cut through the line 2-2 in FIG. 1A is shown in FIG. 1D. For simplicity, in FIG. 1D, the conical heat spreader 115 and fins 120 and transparent cover 135 are not depicted. LED chip 105 can also have other shapes to which the heat transfer collar 132 conforms, such as circular. Although ten surface fins 130 are shown in FIG. 1D, other numbers of surface fins are possible, such as, larger numbers and smaller numbers of surface fins 130. Surface fins 130 are comprised of a material capable of conducting heat, such as, for example, copper, aluminum, or glass. In embodiments of the invention, the surface fins have a thickness that is less than 1 mm, although other thicknesses are also possible. Optionally, the surface fins 130 are coated with a reflective material. The surface fins 130 can be in other relative orientations. The first thermal management component of FIGS. 1A-C, which includes the conical heat spreader 115 and fins 120, and the second thermal management component shown in FIGS. 1A and D, which includes surface fins 130, can optionally be used separately from each other or they can be employed together in a lighting structure.

The lighting structure of FIGS. 1A-D additionally comprises transparent cover 135. Optionally, transparent cover 135 comprises vent holes 140 that are capable of allowing gases (air) to flow between the regions inside and outside of the transparent cover 135. Transparent cover 135 is comprised of a material that is partially or completely transparent to the light emitted by the LED chip, for example, glass, such as the glasses currently used in lighting sources, or plastic. When vent holes 140 are present, gas can flow through the lighting structure as illustrated, for example, by arrow 145 (the direction of flow depicted assumes the device is oriented as shown although other orientations are also possible). The lighting structures additionally comprise plug region 150 that is capable of making an electrical connection with a socket. Plug region 150 can have a shape designed for the socket into which it will fit in order to make an electrical connection and the shape and size of plug region 150. In general, dimensions of the elements of the lighting structures of FIGS. 1A-D can vary based on the use to which the lighting structure will be put. Electrical connections (not shown) can extend through the conical heat spreader 115 between the LED chips 105, the optional additional electronic components, and the plug region 150.

Figure 2A:
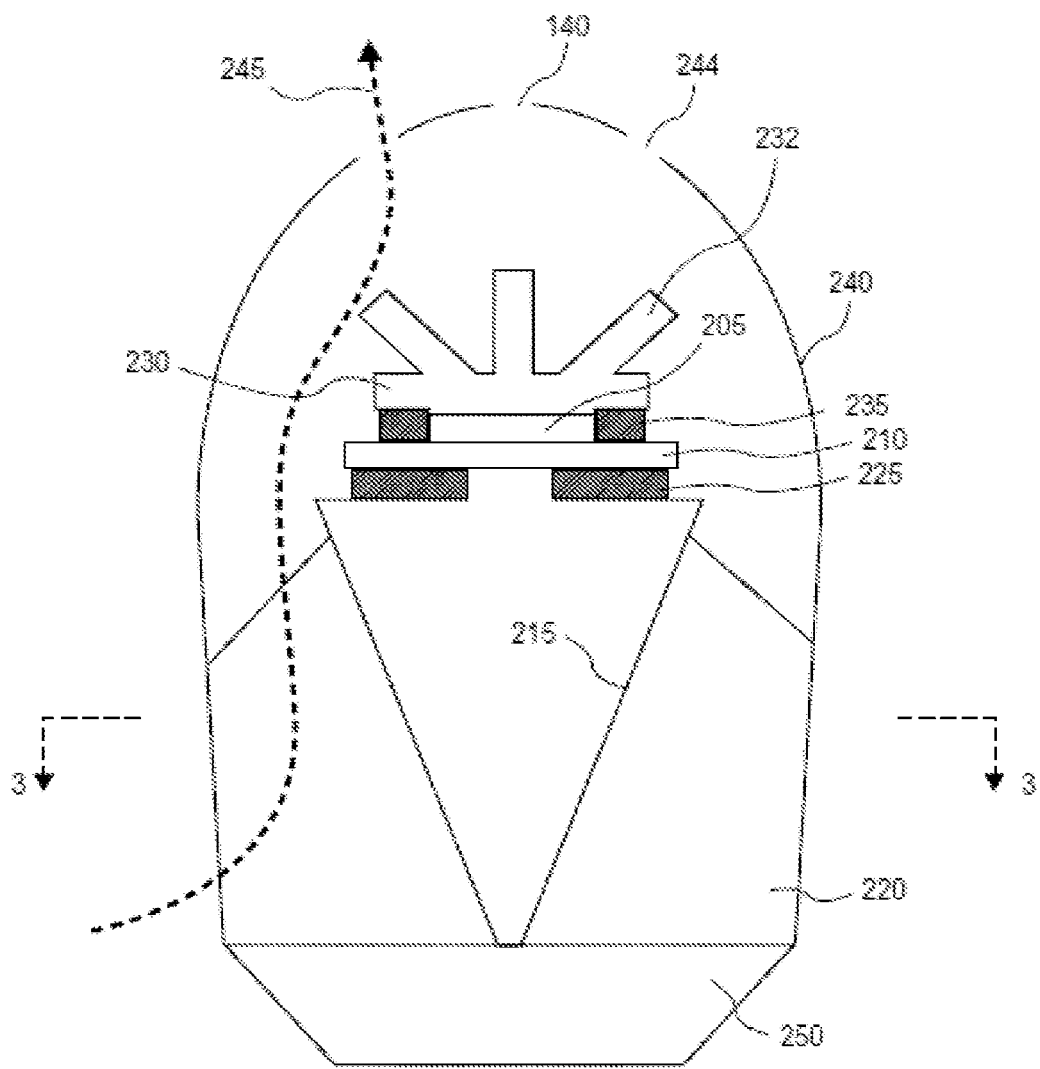
FIGS. 2A-D are schematic diagrams illustrating cross-sectional views of additional lighting systems employing LED chips as light producing elements.
Figure 2B:
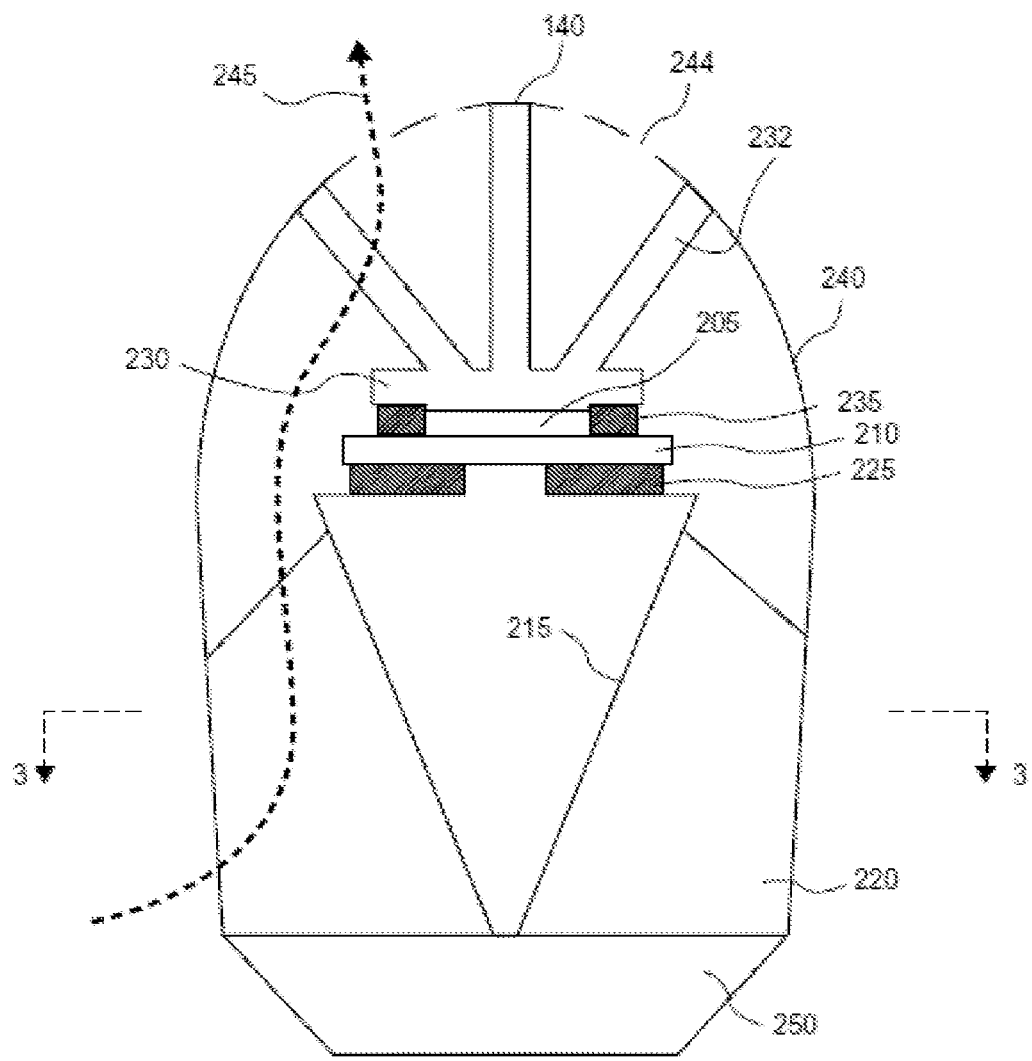
Figure 2C:
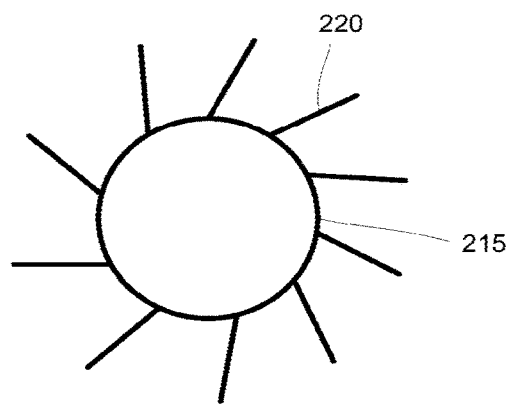
Figure 2D:
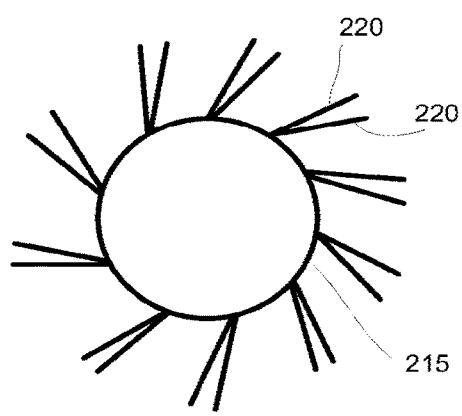

FIGS. 2A-D illustrate additional embodiments of lighting structures in which LED chips are employed as light-producing elements. In FIGS. 2A-B, a LED chip 205 is mounted on a substrate 210. Substrate 210 is a circuit board or other type of substrate, such as, for example, a board or a metal backed board. In embodiments of the invention, the substrate 210 provides electrical interconnections between the LED chip and optional additional electronics (not shown) and a power source (not shown). Optionally, more than one LED chip 205 is mounted on substrate 210. Additional electronics can include LED driver and dimmer control circuits and can be housed on an IC chip mounted on a substrate located for example, inside conical heat spreader 215. Optionally, an IC chip comprising additional electronic components is housed on the substrate 210. Alternately, some or all of these additional electronics can be housed on the LED chip 205 itself. Conical heat spreader 215 comprises radial fins 220. FIGS. 2B and C illustrate alternate cross-sectional views of a cut along the line 3-3 of FIG. 2A. Different geometries and patterns for radial fins are possible. Additionally, although ten radial fins 220 are illustrated in FIG. 2C, and twenty radial fins are illustrated in FIG. 2D, other numbers of radial fins 220 are also possible, including larger and smaller numbers of fins. FIG. 2D shows a plurality of double radial fins 220. Other numbers of associated radial fins 220 are also possible such as triple or quadruple radial fins. Plural radial fins, such as double, triple, and quadruple radial fins are fins that originate from the same location on the conical heat spreader. Radial fins 220 can have sizes, shapes, geometries, relative angles, and/or orientations that are different from the embodiments depicted in FIGS. 2A-D. Comparing FIGS. 1A and 2A-B, two different of a large number of possible shapes for the radial fins 120 and 220 are illustrated. Conical heat spreader 215 is optionally thermally coupled to substrate 210 though thermal interface material 225. Conical heat spreader 215 and fins 220 are comprised of a heat conductive material, such as, for example, a metal, such as for example, copper and/or aluminum, or a thermally conductive plastic, although other materials are also possible. Thermal interface material 225 is comprised of, for example, indium, a phase change material, a ceramic-polymer composite, a metal-polymer composite, or a graphite-polymer composite, where a polymer can be a grease, a gel, an elastomer, or a thermosetting plastic. In alternate embodiments, conical heat spreader 215 is thermally coupled to substrate 210 though physical contact or through a grease, a gel, an elastomer, a thermosetting plastic, or other material.

A second thermal management component shown in FIG. 2A, includes transparent plate 230 that is thermally associated with LED chip 205. The transparent plate 230 can be thermally associated with LED chip 205 through, for example, physical contact. The transparent plate 230 can be bonded to the substrate 210 with a bonding material 235, which is, for example, a thermal interface material (as described herein). Transparent plate 230 has associated protruding members 232, that can have any shape, such as conical, cylindrical, pyramidal, fin-like, or triangular, rectangular, pentagonal, or hexagonal prismatic, or other shape. The protruding members 232 can extend various distances from the transparent plate 230. In FIG. 2B, for example, the protruding members 232 are shown extending to the transparent cover 240. Various numbers of protruding members 232 are also possible. Transparent plate 230 and protruding members 232 are comprised of a material capable of conducting heat such as, for example, glass or plastic, and are transparent to some or all of the light emitted by LED chip 205. In alternate embodiments, protruding members 232 are thin metal fins having a thickness of 0.5 to 1 mm or less than 0.5 mm. The first thermal management component of FIGS. 2A-D, which includes the conical heat spreader 215 and fins 220, and the second thermal management component shown in FIGS. 2A-B, which includes transparent plate 230 and protruding members 232, can optionally be used separately from each other or they can be employed together in a lighting structure.

The lighting structures of FIGS. 2A-D additionally comprise transparent cover 240. Optionally, transparent cover 240 comprises vent holes 244 that are capable of allowing gases (air) to flow between the regions inside and outside of the transparent cover 240. When vent holes 244 are present, gas can flow through the lighting structure as illustrated, for example, by arrow 245. Transparent cover 240 is comprised of a material that is partially or completely transparent to the light emitted by the LED chip, for example, glass or plastic. The lighting structures additionally comprise plug region 250 that is capable of making an electrical connection with a socket. Plug region 250 can have a shape designed for the socket into which it will fit in order to make an electrical connection. In general, the shape and size of the elements of the lighting structures of FIGS. 2A-D can vary based on the use to which the lighting structure will be put. Electrical connections (not shown) can extend through the conical heat spreader 215 between the LED chips 205 and the plug region 250.

Figure 3A:
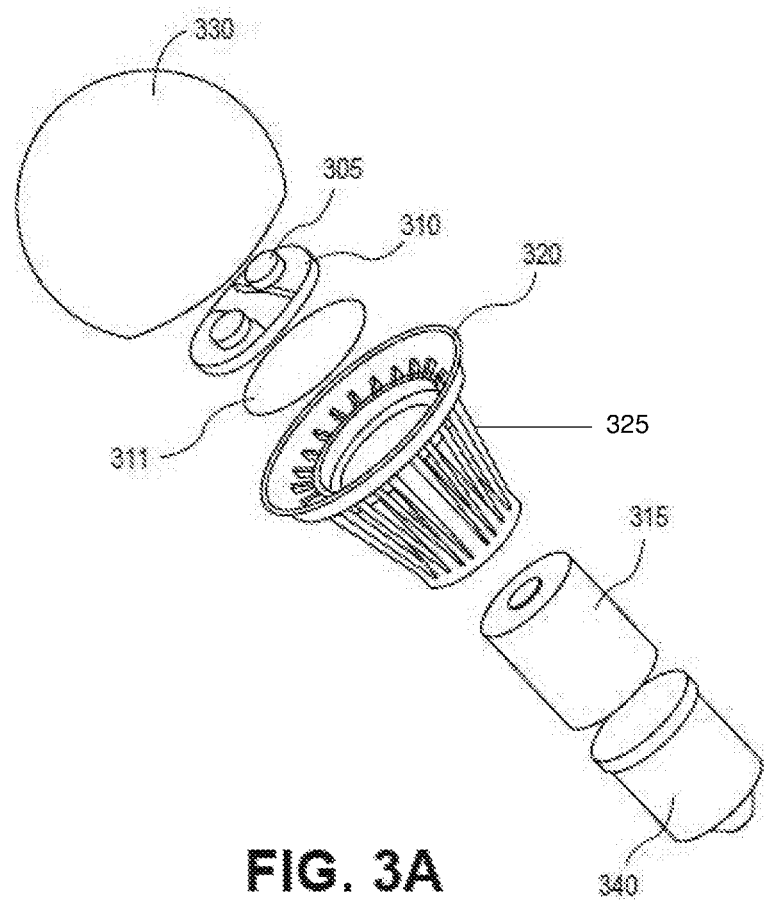
FIGS. 3A-B are schematic diagrams illustrating views of an additional lighting system employing LED chips as light producing elements.
Figure 3B:
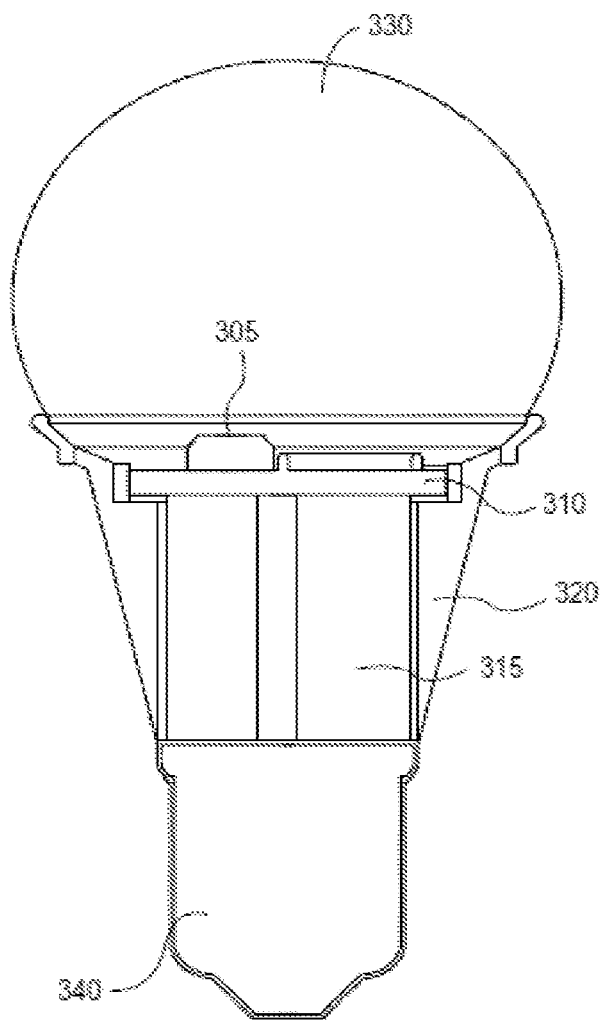

FIGS. 3A-B show additional lighting structures in which LED chips are employed as light-producing elements. FIG.

3A is an exploded diagram of the elements of the lighting structure and FIG. 3B is an assembled structure. Substrate 310 is a circuit board or other type of substrate, such as, for example, a board or a metal backed board. In FIGS. 3A-B two LED chips 305 are mounted on a substrate 310 that optionally provides electrical interconnections between the LED chip and additional electronics (not shown) and a power source (not shown). Optionally, more or less than two LED chips 305 are mounted on substrate 310. Additional electronics can include LED driver, optional dimmer control circuits, and other components, and can be housed on a substrate located inside a space within heat sink 315 or on substrate 310. Alternately, some or all of these additional electronics can be housed on the LED chip 305 itself. Annular heat dissipater 320 comprises fins 325. Although a number of fins 325 are illustrated in FIG. 3A, the number of fins in the lighting structure of FIGS. 3A-B can be smaller or larger than the number illustrated. Plural radial fins, such as double, triple, and quadruple radial fins which are fins that originate from the same location on the conical heat spreader, and different patterns of fins, are also possible. The heat sink 315 and heat dissipater 320 are comprised of a heat conductive material, such as, for example, a metal, such as for example, aluminum and/or copper or a thermally conductive plastic, although other materials are also possible. Heat spreader 311 can have a flat disk shape or a conical shape.

The lighting structures of FIGS. 3A-B additionally comprise transparent cover 330. Transparent cover 330 is comprised of a material that is partially or completely transparent to the light emitted by the LED chip, for example, glass or plastic. The lighting structure additionally comprises plug region 340 that is capable of making an electrical connection with a socket. Plug region 340 can have a shape designed for the socket into which it will fit in order to make an electrical connection. In general, the shape and size of elements of the lighting structure of FIGS. 3A-B can vary based on the use to which the lighting structure will be put. Electrical connections (not shown) can extend through the annular heat sink 315 between the LED chips 305, additional electronic components, and the plug region 340.

Figure 4:
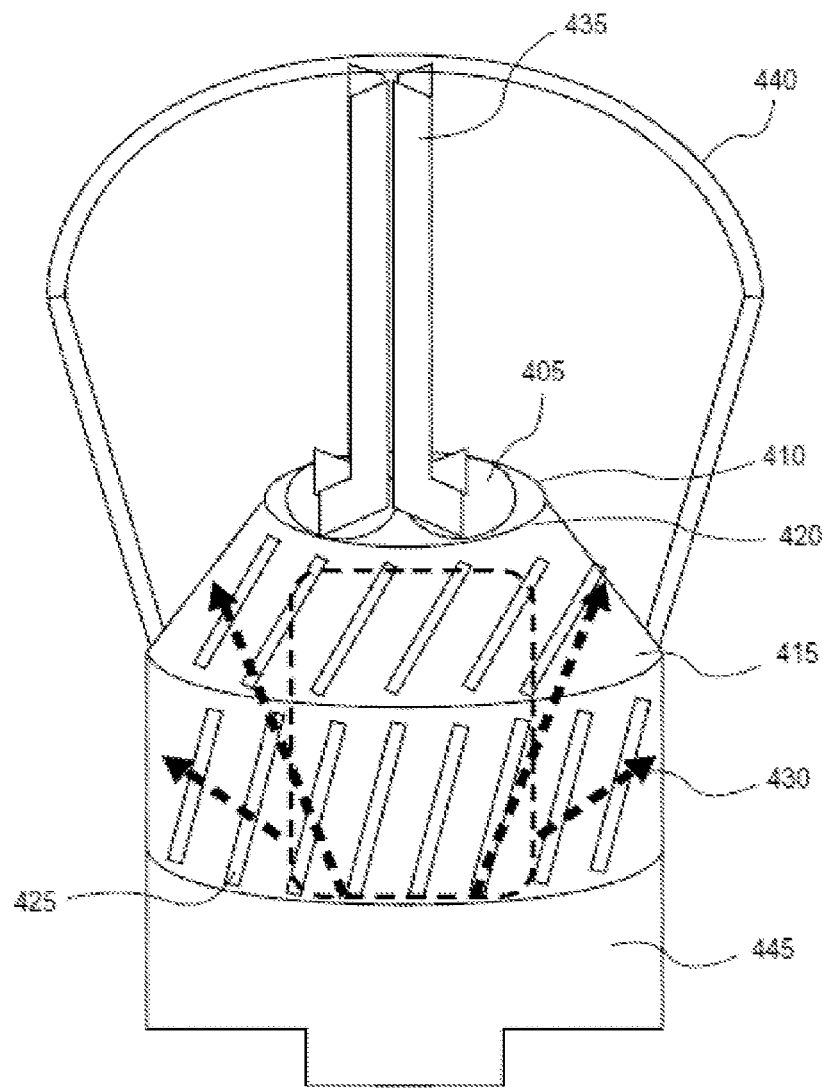
FIG. 4 is a schematic diagram illustrating a further additional lighting system employing LED chips as light producing elements

FIG. 4 shows a further additional lighting structure in which LED chips are employed as light-producing elements. In FIG. 4, LED chips 405 are mounted on a substrate 410. In embodiments of the invention, the substrate 410 is a metal pad or layer that is capable of transferring heat to heat sink 415. In further embodiments, substrate 410 is a circuit board or other type of substrate, such as, for example, a board or a metal backed board. Optionally, a thermal interface material 420 is disposed between the substrate 410 and the heat sink 415. In the alternative, the substrate 410 and the heat sink 415 can make thermal contact through physical contact or through a different material disposed between them. Optionally, one, two, three, or more LED chips 405 are mounted on substrate 410. Heat sink 415 is optionally beveled (as shown) to provide a greater heat diffusion area. Heat sink 415 comprises fins 425 and a cavity inside that is capable of housing, holding, enclosing additional electronics, such as an IC chip comprising LED driver and dimmer circuits (not shown). Plural radial fins, such as double, triple, and quadruple radial fins which are fins that originate from the same location on the conical heat spreader, and different patterns of fins are also possible. Optionally, heat sink 415 also comprises channels and/or slots capable of allowing air flow as illustrated by arrows 430. Slots can allow air to enter the body of the heat sink 415, increasing air flow.

A second thermal management component shown in FIG. 4A, includes transparent fin structure 435 that makes thermal contact with and is capable of removing heat from LED chips 405. The transparent fin structure 435 can be thermally associated with LED chips 405 through, for example, physical contact. Transparent fin structure 435 can extend various distances from the LED chips 405. In FIG. 4, for example, the transparent fin structure 435 is shown extending to the transparent cover 440. Although four fins are shown in FIG. 4, various other numbers of fins in transparent fin structure 435 are also possible. Transparent fin structure 435 is comprised of a material capable of conducting heat. In embodiments of the invention, the transparent fin structure 435 is transparent to some or all of the light emitted by LED chips 405, and is a material, such as, for example, glass or plastic. Optionally, the transparent fin structure 435 comprises a reflective coating on its surface. In other embodiments, the transparent fin structure 435 can be comprised of a metal having a highly reflective surface finish or coating. The first thermal management component of FIG. 4, which includes the conical heat sink 415 and fins 425, and the second thermal management component shown in FIG. 4, which includes transparent fin structure 435, can optionally be used separately from each other or they can be employed together in a lighting structure.

The lighting structure of FIG. 4 additionally comprises transparent cover 440. Transparent cover 440 is comprised of a material that is partially or completely transparent to the light emitted by the LED chips, for example, glass or plastic. The lighting structure additionally comprises plug region 445 that is capable of making an electrical connection with a socket. Plug region 445 can have a shape designed for the socket into which it will fit in order to make an electrical connection. In general, the shape and size of elements of the lighting structure of FIG. 4 can vary based on the use to which the lighting structure will be put. Electrical connections (not shown) can extend through the heat sink 415 between the LED chips 405 and the plug region 445.

Figure 5A:
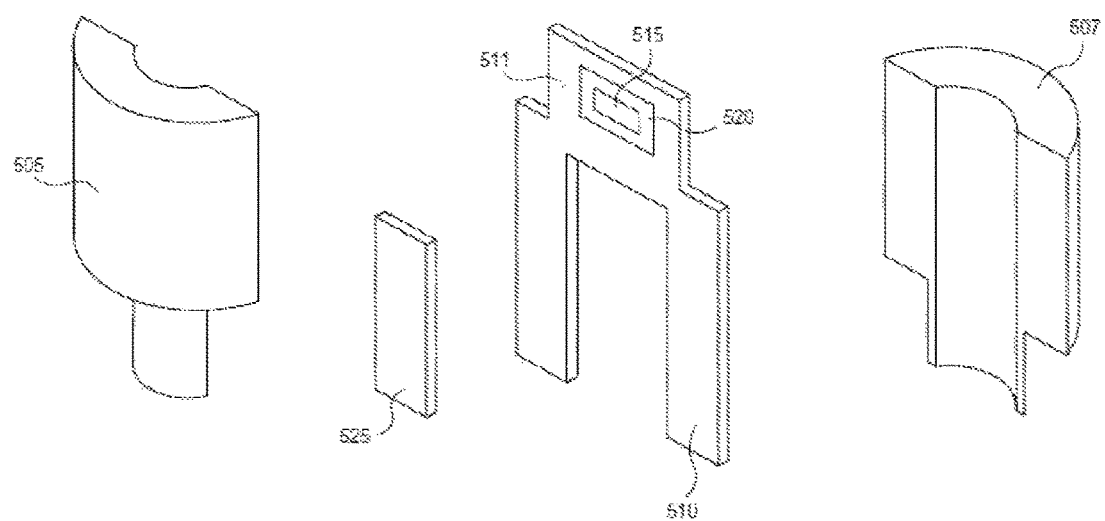
FIGS. 5A-E are schematic diagrams illustrating views of additional lighting systems employing LED chips as light producing elements.
Figure 5B:
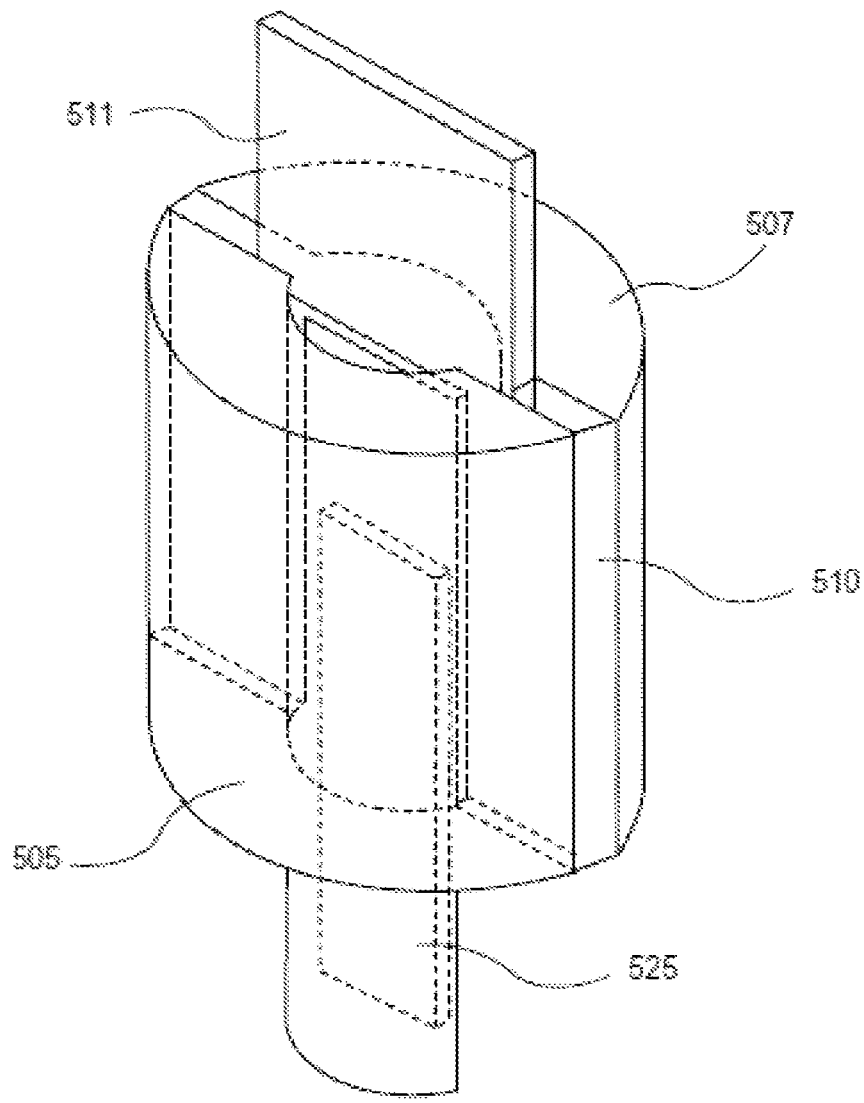
Figure 5C:
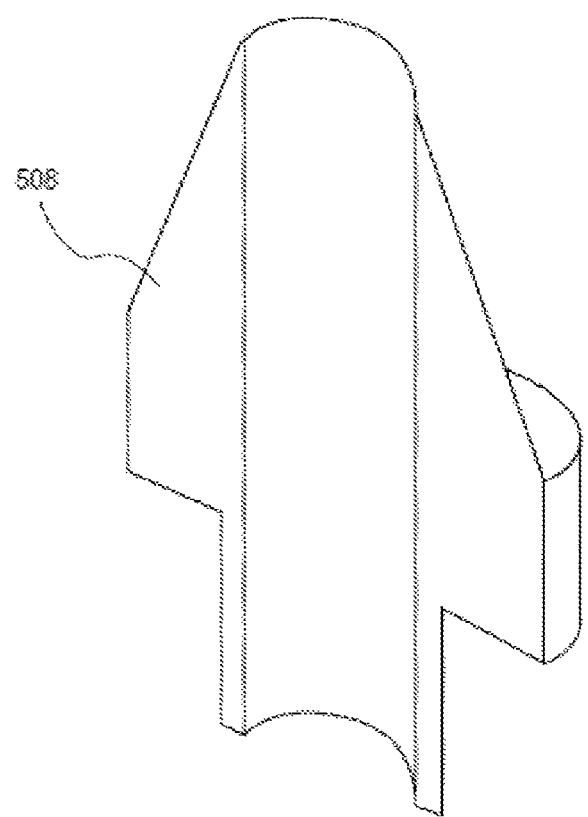

FIGS. 5A-E illustrate further lighting structures in which LED chips are employed as light-producing elements. FIG. 5A is an exploded diagram of several of the elements of the lighting structures. FIG. 5B shows the assembled elements of FIG. 5A. In FIGS. 5A-B, a sectional heat sink is formed in two sections 505 and 507. In embodiments of the invention, the sections 505 and 507 of the heat sink are comprised of a metal such as, for example, aluminum and/or copper, or a thermally conductive plastic, although other materials are also possible. In embodiments of the invention, the sectional heat sink is an annular heat sink (as shown) although other shapes are also possible. FIG. 5C shows one of other possible shapes for a first section 508 of the sectional heat sink (the second section is the mirror image of the first section 508) having a tapered or semi-conical exterior and a semi-annular section. The sectional heat sink could also have other shapes such as an exterior having four (or more) sides when assembled and presenting a square or rectangular (or pentagon, hexagon, etc.) footprint rather than a circular one. In the assembled lighting structure, a heat spreader 510 is located between the first section 505 and the second 507 of the heat sink, makes contact with both sections 505 and 507 of the sectional heat sink, and is capable of transferring heat to the sectional heat sink. A section 511 of the heat spreader 510 extends beyond a surface of the sectional heat sink. One or more LED chip(s) 515 and substrate 520 are located on the section 511 of the heat spreader 510 that extends beyond the sectional heat sink 505 and 507. Optionally, additional LED chip(s) and substrate (not shown) are located on the opposite face of the heat spreader 510 in the region 511 that the heat spreader 510 extends beyond the sectional heat sink 505 and 507 in the assembled structure. FIG. 5B, which shows the assembly of the elements of FIG. 5A but omits the LED chip(s) 515 and substrate 520 for ease of illustration. The heat spreader 510 is comprised of, for example, a metal, such as aluminum and/or copper, or a thermally conductive plastic, although other materials are also possible. A circuit board 525 (or other substrate) comprising electronics, such as an IC chip comprising LED driver and optional dimmer control circuits is located inside sectional heat sink 505 and 507. Alternately, some or all of these additional electronics can be housed on a LED chip 515 itself. The circuit board 525 is operably coupled to the LED chip(s) 515 through, for example, wires that extend into the interior of sectional heat sink 505 and 507.

Figure 5D:
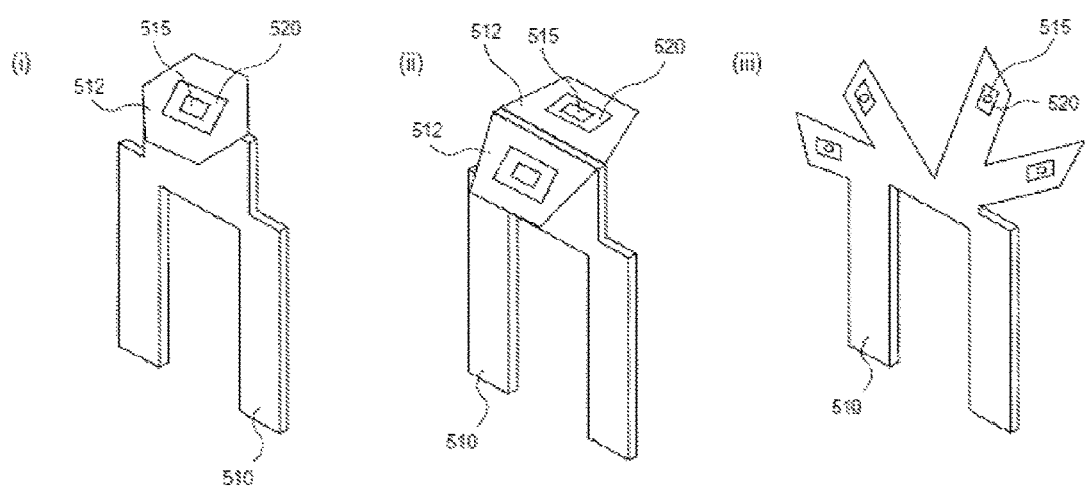

FIG. 5D provides additional embodiments of the invention for the heat spreader 510. Other shapes for heat spreader 510 are also possible. In FIG. 5D structures (i)-(iii), LED chips 515 and substrates 520 are located on regions 512 of the heat spreader 510 that are disposed at an angle relative to the main body of the heat spreader 510 and/or on separate arm-like structures. In structure (iii), the LED chips 515 and structures 520 can be located on both sides of the arms. The heat spreader 510 can be formed, for example, from two separate parts located next to each other as shown in structure (ii). In alternate embodiments, the heat spreader 510 is formed from two or more parts. Regions of the parts of the heat spreaders that extend beyond the sectional heat sink can be disposed at different relative angles to the regions that are located between the sections of the heat sink. Heat spreaders 510 of FIG. 5D can provide the ability to direct or aim light emitted from the LED chip in desired direction(s) thus providing light output having a shape other than a conical one.

Figure 5E:
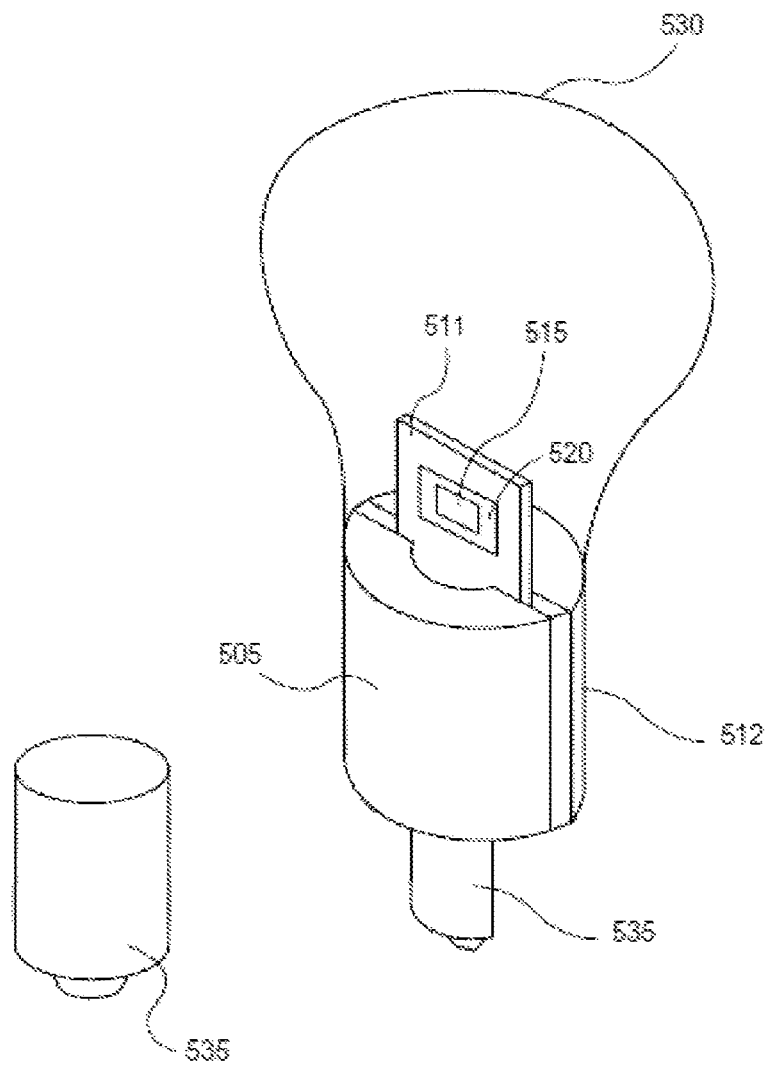

FIG. 5E shows an assembly for the lighting structure in which the assembled structure of FIG. 5B additionally comprises transparent cover 530 and plug region 535. Plug region 535 can have a shape designed for the socket into which it will fit in order to make an electrical connection and the shape and size of plug region 535 can vary based on the use to which the lighting source of FIGS. 5A-E will be put. Electrical connections (not shown) can be made between circuit board 525 and the plug region 535. Additionally, in embodiments of the invention, the plug region is designed to fit over a bottom section of the assembled heat sink 505 and 507. Transparent cover 530 is comprised of a material that is partially or completely transparent to the light emitted by the LED chip, for example, glass or plastic.

In general, a LED chip can comprise one light-emitting diode or an array of light-emitting diodes. Embodiments of the invention are not limited to LED chips having a particular type, size, wattage, color spectrum, and/or number of LEDs and embodiments of the invention are capable of being used with various types of LED chips or LED arrays in general. LED chips can also comprise additional electronics, such as LED drivers and dimmer circuits.

In embodiments of the invention, the substrate can be a substrate that provides connections between and among electronic components, such as chips, and power supplies. Semiconductor chips can be attached to one or both sides of the substrate. Substrates can be used to provide electrical connections between small-scale semiconductor chips and larger-scale power sources. Substrates can be, for example, wireboards or circuitboards.

Persons skilled in the relevant art appreciate that modifications and variations are possible throughout the disclosure as are substitutions for various components shown and described. Reference throughout this specification to "one embodiment" or "an embodiment" means that a particular feature, structure, material, or characteristic described in connection with the embodiment is included in at least one embodiment of the invention, but does not necessarily denote that they are present in every embodiment. Furthermore, the particular features, structures, materials, or characteristics disclosed in the embodiments may be combined in any suitable manner in one or more embodiments. For example, second thermal management components shown in FIG. 1A can be used in the lighting structures of FIG. 2A-D (in place of the second thermal management components of FIGS. 2A-D), FIG. 3A-B, FIG. 4, and some of the embodiments of FIGS. 5A-E; the second thermal management components of FIGS. 2A-B can be used with the lighting structures of FIGS. 1A-D (in place of the second thermal management components of FIGS. 1A-D), FIGS. 3A-B, FIG. 4 (in place of the second thermal management components of FIG. 4), and some of the embodiments of FIGS. 5A-E; and the second thermal management component of FIG. 4 can be used with the lighting structures of FIGS. 1A-D (in place of the second thermal management components of FIGS. 1A-D), FIG. 2A-D (in place of the second thermal management components of FIGS. 2A-D), FIGS. 3A-B, and some of the embodiments of FIGS. 5A-E. Various additional structures may be included and/or described features may be omitted in other embodiments.

We claim:

1. A device comprising,
  at least one light-emitting diode chip on a first side of a substrate;
  a heat sink attached to a second side of the substrate on a first end of the heat sink wherein the heat sink also comprises a second end, an interior region, an exterior surface, and a plurality of fins extending from the exterior surface of the heat sink;
  a transparent fin structure comprising a plurality of fins radiating from a central axis wherein the transparent fin structure is disposed on a surface of the at least one light-emitting diode chip; and
  a plug region attached to the second end of the heat sink wherein the plug region is capable of making an electrical connection with an electrical socket and wherein the plug region is electrically coupled to the at least one light-emitting diode chip through the interior region of the heat sink.

2. The device of claim 1 wherein the heat sink additionally comprises one or more channels wherein the channels are capable of allowing air from the exterior of the heat sink to pass into and out of the channels.

3. The device of claim 1 wherein the exterior of the heat sink comprises a beveled region.

4. The device of claim 1 wherein the device additionally comprises light-emitting diode driver circuits between and electrically coupled to the at least one light-emitting diode chip and the plug region.

5. The device of claim 1 wherein the plurality of fins extending from the exterior surface of the heat sink are double fins wherein double fins are two fins that are attached to a same location on the surface of the heat sink.

6. The device of claim 1 wherein the transparent fin structure comprises a reflective coating on a surface.

7. The device of claim 1 further comprising a transparent cover disposed over the transparent fin structure.

8. A device comprising, at least one light-emitting diode chip on a first side of a substrate;
a transparent fin structure comprising a plurality of fins radiating from a central axis wherein the transparent fin structure is disposed on a surface of the at least one light-emitting diode chip;
a transparent cover disposed over the at least one light-emitting diode chip wherein the transparent fin structure is disposed between the substrate and the transparent cover; and
a plug region capable of making an electrical connection with an electrical socket wherein the plug region is electrically coupled to the at least one light-emitting diode chip.

9. The device of claim 8 wherein the transparent fin structure comprises a reflective coating on a surface.

10. The device of claim 8 wherein the transparent fin structure extends from the at least one light-emitting diode chip to the transparent cover.

* * * * *